United States Patent
Kuroda

(10) Patent No.: US 7,656,732 B2
(45) Date of Patent: Feb. 2, 2010

(54) SEMICONDUCTOR STORAGE DEVICE

(75) Inventor: Naoki Kuroda, Osaka (JP)

(73) Assignee: Panasonic Corporation, Osaka (JP)

(*) Notice: Subject to any disclaimer, the term of this patent is extended or adjusted under 35 U.S.C. 154(b) by 9 days.

(21) Appl. No.: 12/191,011

(22) Filed: Aug. 13, 2008

(65) Prior Publication Data

US 2009/0116318 A1 May 7, 2009

(30) Foreign Application Priority Data

Nov. 1, 2007 (JP) ............................ 2007-285136
Dec. 27, 2007 (JP) ............................ 2007-337073

(51) Int. Cl.
*G11C 7/02* (2006.01)
(52) U.S. Cl. ......................... 365/207; 365/210
(58) Field of Classification Search .................. 365/207, 365/210, 205, 203
See application file for complete search history.

(56) References Cited

U.S. PATENT DOCUMENTS 6,009,040 A * 12/1999 Choi et al. ............... 365/210.1
6,504,778 B1 * 1/2003 Uekubo .................. 365/189.15
2002/0080670 A1   6/2002 Kawasumi
2003/0103397 A1 * 6/2003 Lee ............................ 365/203
2006/0050569 A1   3/2006 Shimizu
2007/0041260 A1 * 2/2007 Hong et al. ................. 365/208

FOREIGN PATENT DOCUMENTS

JP    06-176568    6/1994
JP    07-093972    4/1995

* cited by examiner

*Primary Examiner*—Anh Phung
(74) *Attorney, Agent, or Firm*—McDermott Will & Emery LLP

(57) ABSTRACT

In a semiconductor storage device, such as a dynamic random access memory (DRAM), in which dynamic data is amplified and read on a bit line, a data line sense amplifier/write buffer connected to a data line of a memory array and a data line sense amplifier control signal generating logic circuit connected to a dummy data line of a dummy memory array are provided. A sense amplifier is activated in accordance with an output signal of the logic circuit.

27 Claims, 13 Drawing Sheets

SEMICONDUCTOR STORAGE DEVICE

BACKGROUND OF THE INVENTION

1. Field of the Invention

The present invention relates to semiconductor storage devices, such as a dynamic random access memory (DRAM) and the like.

2. Description of the Related Art

In recent years, higher-speed performance is highly required for semiconductor storage devices, particularly embedded memories used in system LSIs. To achieve this, there is a known technique in which a replica circuit is used to logically determine timing with which data on a bit line read from a memory cell is amplified by a sense amplifier. This technique enables optimization of a timing margin and can also reduce influence of external conditions, process variations or the like.

FIG. 15 shows a circuit configuration of a conventional DRAM including a replica circuit. The device comprises memory cells MC each including a transistor and a capacitor, word lines WL0 and WL1, bit line pairs BL0 to BLn/XBL0 to XBLn, sense amplifiers SA0 to SAn for amplifying data on the bit line pairs BL0 to BLn/XBL0 to XBLn, a dummy memory cell DMC, a dummy word line DWL, a dummy bit line pair DBL/XDBL, a data detecting circuit 201 for detecting data on the dummy bit line pair DBL/XDBL to output a signal, and an SA control generating circuit 202 for activating the sense amplifiers SA0 to SAn (see, for example, Japanese Unexamined Patent Application Publication No. H06-176568).

A core operation of the thus-configured conventional semiconductor storage device will be described with reference to a timing chart of FIG. 16. Initially, when an access request is input to the DRAM, a selected word line WL0 is activated, so that electric charges are transferred from the memory cells to the bit lines BL0 to BLn. At the same time, the dummy word line DWL is also activated, so that electric charges are similarly transferred to the dummy bit line DBL. This operation of transferring electric charges allows a change in potential level of the dummy bit line DBL to exceed a threshold of the data detecting circuit 201, thereby activating the SA control generating circuit 202, which in turn generates an SA control signal SEN. This signal activates the sense amplifier SA, which in turn amplifies the bit line pair BL/XBL to a desired potential.

Thus, by using a dummy memory cell to logically determining the time course (timing) of an operation for amplification of bit line data, an erroneous circuit operation can be eliminated, and the timing can be optimized, resulting in a faster operation.

SUMMARY OF THE INVENTION

However, in the conventional configuration, in which electric charges are used to detect the level, if the potential change does not exceed the threshold, the circuit does not correctly operate. Particularly, since memory cells have a considerably small capacitance, the problem is not negligible due to process variations, leakage current or the like.

Also, when the set threshold is, for example, a transistor threshold, the potential is typically significantly large as compared to a change in potential appearing on a bit line from a memory cell. Therefore, it is necessary to provide a layout structure that is significantly different from a typical memory cell array because of, for example, a reduction in electric charge amount of a dummy memory cell, a reduction in parasitic capacitance of a bit line, and the like. In this case, it is difficult for the replica circuit to produce correct timing with which a sense amplifier is activated.

Also, when a reference potential or the like is used to read out a very small potential difference, it is disadvantageously necessary to design a circuit for generating a reference potential that can reduce an influence of process variations, external conditions or the like. There also disadvantageously occurs an area overhead due to provision of a reference circuit.

Also, in a circuit configuration, such as a DRAM, that requires three memory cell operations of: 1) reading of electric charges; 2) sensing and restoring; and 3) precharging, it is desirable to increase the speed of the electric charge reading operation without significantly hindering the operating speed and access time of the whole memory cell.

Also, in a memory, such as a DRAM, in which data is stored by accumulating electric charges in a capacitor and which is different from a circuit configuration, such as a static random access memory (SRAM), in which data is read out by transferring a current to a bit line, the number of memory cells connected to a bit line is limited by the ratio of the capacitance of a memory cell and the parasitic capacitance of a bit line, and the sensitivity of a sense amplifier. Therefore, although a wide variety of memory capacities may be provided by arbitrarily changing the number of memory cells connected to a bit line, i.e., the number of word lines (e.g., when the number of word lines is 16 to 512 and the number of bit lines is 512, the memory capacity ranges from 8 Kbits to 256 Kbits), a trade-off between the optimal timing of activation of a sense amplifier generated using a replica circuit, depending on the memory capacity, and the area overhead of the replica circuit cannot be resolved.

Further, when a large memory capacity and various specifications are required as in an embedded memory, particularly an embedded DRAM, it is more effective in terms of the stability of a circuit operation and a reduction in circuit area to change the number of memory arrays including bit lines without changing the number of memory cells connected to a bit line than to change the number of memory cells connected to a bit line, depending on the memory capacity. Therefore, in order to achieve higher speed, it is more desirable to logically determine the timing of activating a sense amplifier that amplifies a data line whose wiring length and load significantly change, depending on the memory capacity than to logically determine the timing of activating a sense amplifier that amplifies a bit line. This is also important for easy achievement of various memory specifications.

In view of the above-described problems, the present invention has been achieved. An object of the present invention is to provide a semiconductor storage device in which the timing of activating a sense amplifier that amplifies a data line that varies, depending on a memory capacity, and has a largest load on a data access time, is logically determined, so that a short access time can be achieved and various memory specifications can be easily achieved.

To achieve the object, a semiconductor storage device according to an aspect of the present invention comprises a memory cell, a word line and a bit line connected to the memory cell, a first sense amplifier connected to the bit line, a dummy memory cell, a dummy bit line connected to the dummy memory cell, a second sense amplifier connected to the dummy bit line, a data line connected to the first sense amplifier, a third sense amplifier connected to the data line, a dummy data line connected to the second sense amplifier, and a logic circuit connected to the dummy data line. An output signal of the logic circuit is an input signal that activates the third sense amplifier.

Further, the logic circuit detects that a potential on the dummy data line of static data generated by the second sense amplifier amplifying dynamic data read out to the dummy bit line exceeds a switching potential of a transistor, and outputs a signal as an input signal for activating the third sense amplifier.

Thus, by providing the replica circuit configuration that generates the timing of the third sense amplifier for amplifying the data line using a potential level on the dummy data line amplified and transferred by the second sense amplifier, it is possible to generate optimal transfer timing of the data line whose load significantly varies depending on each memory capacity.

Also, in the configuration the second sense amplifier is used to cause a current to flow through the dummy data line and perform detection using the logic circuit, it is possible to avoid a failure in circuit operation (e.g., the threshold of the detection circuit is not exceeded) and a significant change in layout structure of a dummy circuit portion. Therefore, it is possible to avoid an influence of process variations and external conditions.

Also, the word line connected to the dummy memory cell is the same as the word line connected to the memory cell. Therefore, an area overhead of a replica circuit can be eliminated. In addition, timing is created by activation from a place physically close to an accessed memory cell, so that timing error can be reduced.

Also, the dummy memory cell is arranged adjacent to a row decoder including a word driver, and a delay circuit for adjusting output timing of the logic circuit is provided. Therefore, the timing of activating the third sense amplifier is generated earliest, so that a quick access time can be achieved. In addition, the delay circuit can be used to finely adjust the timing of activating the third sense amplifier, thereby making it possible to prevent an erroneous operation due to excessively early timing.

Also, two or more second sense amplifiers are connected to the dummy data line via switches. Therefore, for example, when the ratio of the threshold level of the logic circuit to the threshold level of the third sense amplifier is 4:1, optimal timing of activating the third sense amplifier can be achieved by linking four second sense amplifiers.

Also, the logic circuit has a function of calculating a logical sum of two or more dummy data lines, and pieces of data on the two or more dummy data lines have the same logical value. Thus, by generating the timing of activating the third sense amplifier using the logical sum of dummy data, even if an erroneous signal is transferred to one dummy data line, it is possible to avoid a situation that an activation timing signal for the third sense amplifier is not generated.

Further, by providing a redundant configuration, if a defect occurs in the word line or the memory cell or dummy memory cell connected to the word line, the memory can be relieved by replacing the defective word line with a redundant word line.

Also, by providing a section for reading data of the dummy memory cell to the outside, it is possible to determine whether or not a replica circuit for the data line is defective.

As described above, according to the present invention, the timing of activating a sense amplifier for amplifying a data line having a heaviest load during a data access time (the load of a data line varies depending on the memory capacity) is logically determined, so that a quick access time can be achieved and various memory specifications can be easily achieved.

DETAILED DESCRIPTION OF THE PREFERRED EMBODIMENTS

Hereinafter, embodiments in the best mode of the present invention will be described with reference to the accompanying drawings.

First Embodiment

Figure 1:
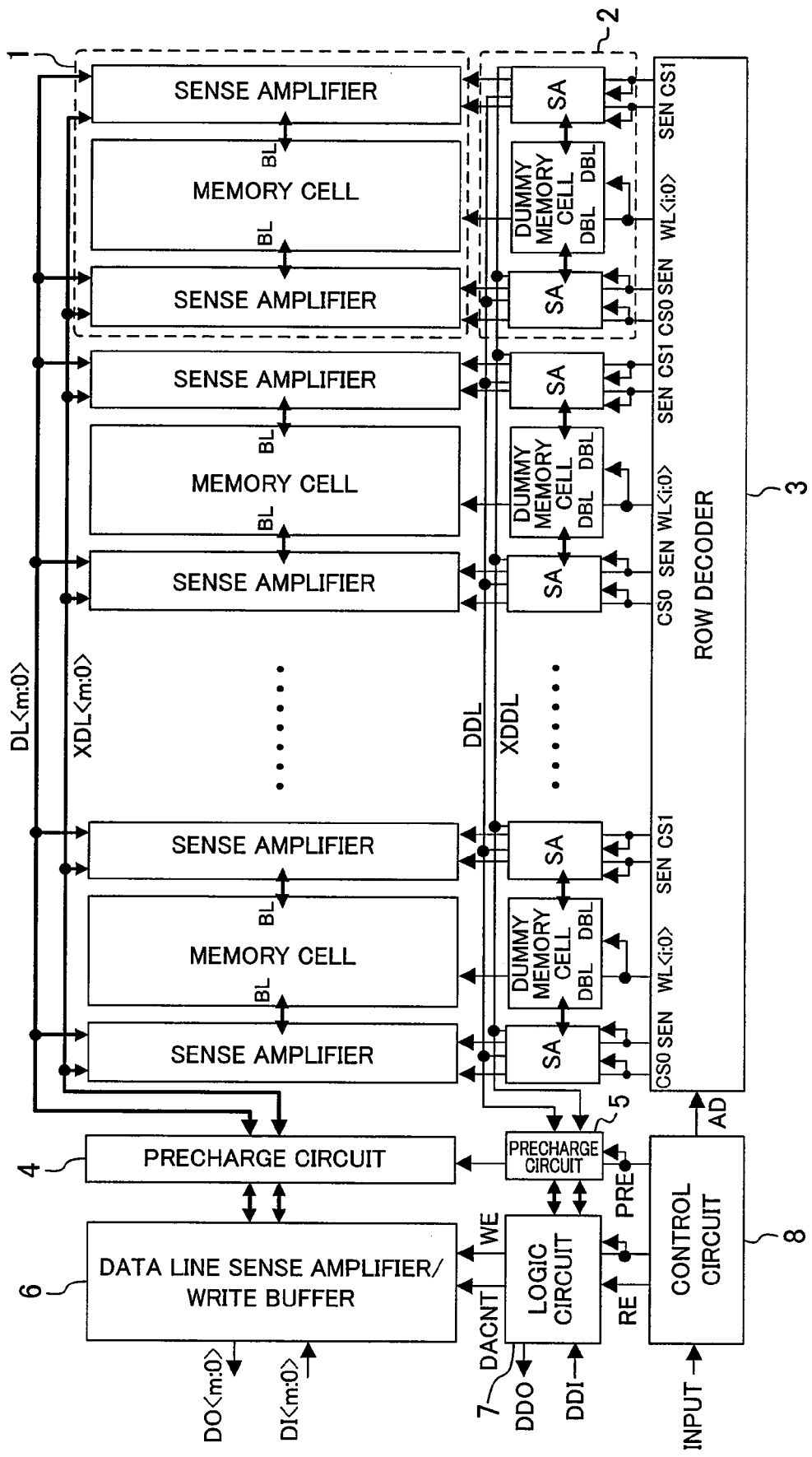
FIG. 1 is a block diagram showing a major configuration of a semiconductor storage device according to a first embodiment of the present invention.

FIG. 1 is a block diagram showing a major configuration of a semiconductor storage device according to a first embodiment of the present invention. In FIG. 1, the semiconductor storage device comprises a memory array 1 including memory cells each including a transistor and a capacitor, word lines and bit lines connected to the memory cells, and sense amplifiers connected to the bit lines, a dummy memory array 2 including dummy memory cells each including a transistor and a capacitor (the dummy memory cell may or may not have the same circuit configuration as that of the memory cell including a transistor and a capacitor), word lines and dummy bit lines connected to the dummy memory cells, and sense amplifiers connected to the dummy bit lines, a row decoder 3 for selecting and activating the word lines connected to the memory cells and the dummy memory cells, a precharge circuit 4 for precharging a data line pair DL<m:0>/XDL<m:0> for data access to the memory array 1, a precharge circuit 5 for precharging a dummy data line pair DDL/XDDL for data access to the dummy memory array 2, a circuit block (data line sense amplifier/write buffer) 6 including a write buffer for writing data to the data line pair DL<m:0>/XDL<m:0> and a data line sense amplifier for amplification when data is read out, a data line sense amplifier control signal generating logic circuit 7 for generating a signal for activating the data line sense amplifier 6 when a potential of the dummy data line DDL exceeds a predetermined threshold, and a control circuit 8 for controlling a memory operation.

Figure 2:
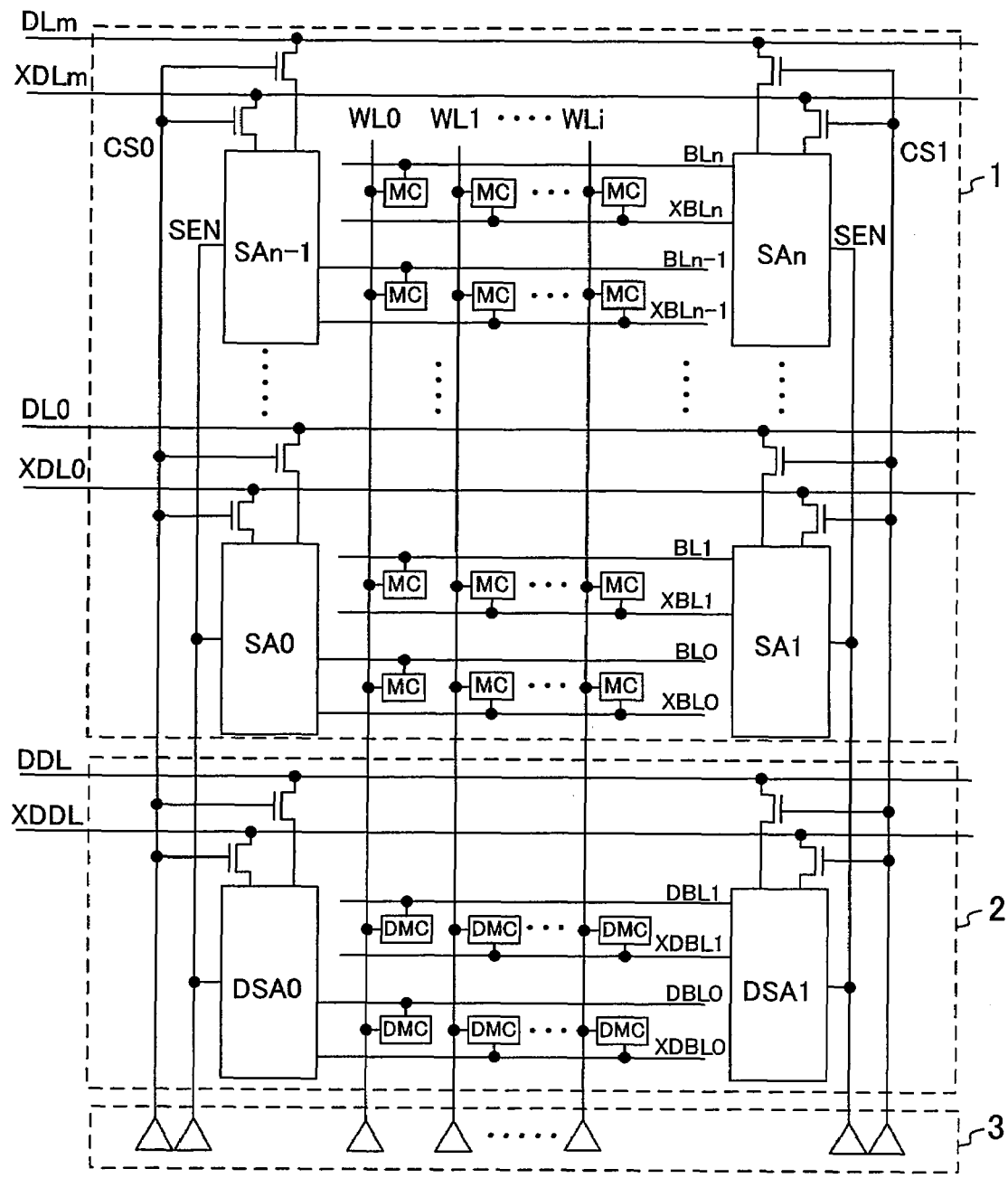
FIG. 2 is a block diagram showing a specific circuit configuration of a memory array, a dummy memory array and a row decoder of FIG. 1.

FIG. 2 shows a specific circuit configuration of the memory array 1, the dummy memory array 2, and the row decoder 3. Here, the number of memory cells connected to a bit line of the memory array 1 and the number of dummy memory cells connected to a dummy bit line of the dummy memory array 2 are determined based on the ratio of the cell capacitance and the parasitic capacitance of the bit line or the dummy bit line, the sensitivity of the sense amplifier, and a required rate of the memory.

Figure 3:
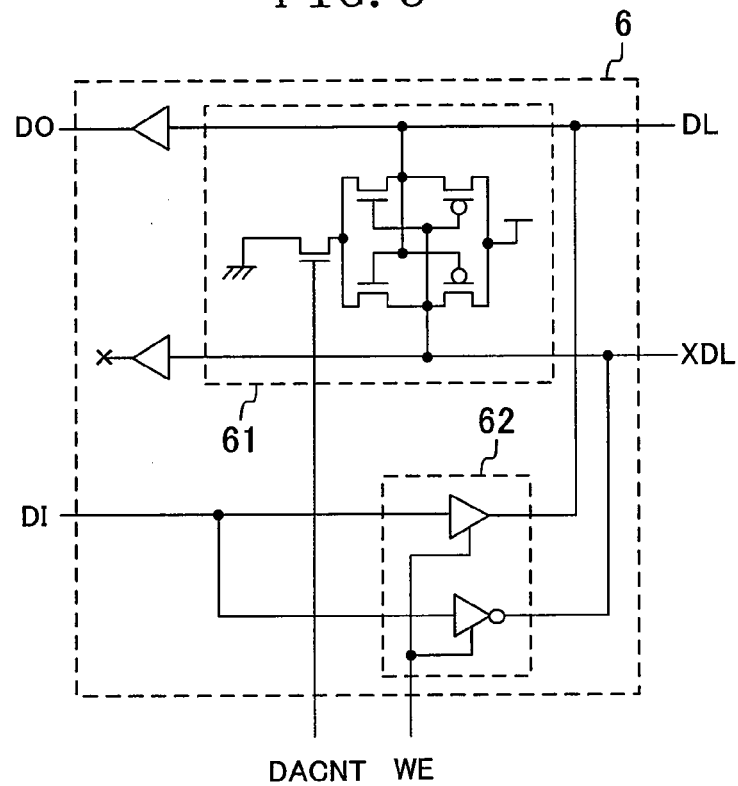
FIG. 3 is a circuit diagram showing a specific circuit configuration of a data line sense amplifier/write buffer of FIG. 1.

FIG. 3 shows a specific circuit configuration of the data line sense amplifier/write buffer 6. In FIG. 3, the data line sense amplifier/write buffer 6 comprises a data line sense amplifier 61 and a write buffer 62.

Figure 4:
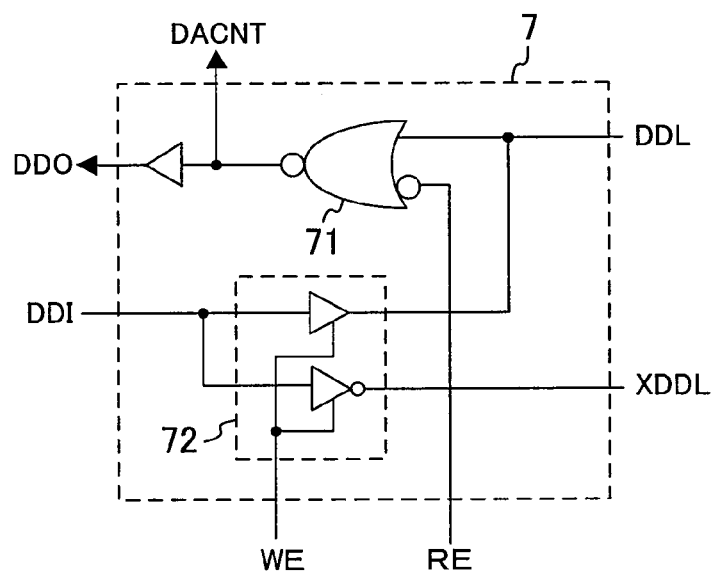
FIG. 4 is a circuit diagram showing a specific circuit configuration of a data line sense amplifier control signal generating logic circuit of FIG. 1.

FIG. 4 shows a specific circuit configuration of the data line sense amplifier control signal generating logic circuit 7. In FIG. 4, the data line sense amplifier control signal generating logic circuit 7 comprises a NOR circuit 71 and a dummy write buffer 72.

A replica circuit operation of the dummy memory cell of the thus-configured semiconductor storage device will be described using a timing chart shown in FIG. 5. Initially, when a read request is input to the memory, the control circuit 8 generates a read operation reference signal REA and transfers an input address signal to the row decoder 3. A selected word line WL0 is activated by a decode signal. Thereby, data is transferred from a memory cell MC to a bit line BL. At the same time, L data is transferred from a dummy memory cell DMC to a dummy bit line DBL. Thereby, the potential of the dummy bit line DBL that has been precharged to ½ of a power supply voltage VDD (or the H level) increases toward the L level by the ratio of the parasitic capacitance of the dummy bit line BL and the cell capacitance of the dummy memory cell DMC. At the same time, a peripheral circuit read operation reference signal RE is also generated.

Next, after a predetermined delay time for transfer of electric charges from the memory cell MC and the dummy memory cell DMC, the signal SEN that activates the sense amplifiers SA0 to SAn and DSA0 and DSA1 connected to the bit lines BL/XBL and the dummy bit lines DBL/XDBL, goes to the H level. Thereby, each bit line BL/XBL is amplified to the H or L level. At the same time, the dummy bit line DBL is amplified to the L level. Note that the sense amplifiers SA0 to SAn and DSA0 and DSA1 may have the same circuit so as to equalize the process pattern and eliminate variations in timing of sensing operations of the bit line and the dummy bit line. Alternatively, the sense amplifiers SA0 to SAn and DSA0 and DSA1 may have different circuit configurations.

Next, a column switch signal CS0 for transferring data on the bit lines BL/XBL and the dummy bit lines DBL/XDBL to data lines DL/XDL and dummy data lines DDL/XDDL precharged to the power supply voltage VDD is caused to go to the H level, i.e., is activated, so that desired data is transferred from the bit lines BL/XBL to the data lines DL/XDL, respectively, and L-level data is transferred from the dummy bit line DBL to the dummy data line DDL. The L-level data amplified by the sense amplifier DSA0 causes the dummy data line DDL to the ½-VDD-level potential after a predetermined time. The dummy data line DDL is connected to one input of the NOR circuit 71 of the data line sense amplifier control signal generating logic circuit 7. A switching level of a CMOS transistor connected to the input signal is ½ VDD (i.e., the output logic of the CMOS transistor is inverted). The other input of the NOR circuit 71 has an inverted signal of the H-level signal of the peripheral circuit read operation reference signal RE. Therefore, an output signal DACNT of the data line sense amplifier control signal generating logic circuit 7 goes to the H level, so that the replica circuit operation is completed.

Next, the H-level signal DACNT activates the data line sense amplifier 6, which in turn amplifies data on the data lines DL/XDL, so that the data lines DL/XDL go to the H level and the L level, respectively. The amplified data on the data line DL is transferred via a buffer circuit to an output DO, i.e., a read operation is thus performed.

Finally, the read operation reference signal REA and the peripheral circuit read operation reference signal RE go to the L level after a predetermined period of time, so that the internal circuit of the memory goes to the standby state to get ready for the next operation.

As described above, when the transfer of electric charges does not cause the potential change to exceed the threshold, an expected operation can no longer be achieved. Also, for the timing of activating the sense amplifier for amplifying data on a bit line having a fixed load capacitance, the sense amplifier are used to perform data transfer via a current using a fixed delay time provided by, for example, a transistor delay circuit, so that a desired potential can be certainly obtained after a predetermined time. Also, for the timing of activating the sense amplifier for amplifying data on the data line whose load capacitance significantly changes, depending on the memory capacity, an output signal of a replica circuit including a dummy bit line, a sense amplifier, a column switch, and a dummy data line having the same circuit configuration as that of the memory cell, the bit line, the sense amplifier, the column switch, and the data line, and a simple level detecting circuit, such as a NOR circuit, can be used so that, when, for example, the memory capacity is thereby reduced, i.e., the data line is reduced, and therefore, the circuit load is reduced, the time required for the dummy data line to reach the potential of ½ VDD is reduced, and therefore, the data line sense amplifier is quickly activated, resulting in faster data output, i.e., a shorter access time. Also, for example, when the memory capacity increases, i.e., the data line load increases, the predetermined time for activation of the data line increases, so that the data line sense amplifier can be more stably and more quickly activated than when a timing generating circuit including a delay circuit, which is easily affected by process variations or external conditions, is used.

Although the NOR circuit 71 is used in FIG. 4, any circuit configuration that can be implemented using a simple circuit operation, such as a switching function or the like, of a CMOS transistor, may be used. Also, apart from this, it is important in terms of optimization of timing to add a configuration in which a transistor having the same load as that of the data line sense amplifier 61 is connected to the dummy data line.

Also, since the memory cell and the dummy memory cell each include a transistor and a capacitor, a higher operation can be achieved when accumulated data is dynamic data. Any configuration in which dynamic data is accumulated in the memory cell may be employed. For example, the memory cell may include two transistors and two capacitors.

Also, by using a common word line connected to the memory cell and the dummy memory cell, a dummy word line no longer needs to be additionally provided for the replica circuit, resulting in a reduction in circuit area. In addition, since the same word line is used, the gates of the access transistors in the memory cell and the dummy memory cell can be activated with the same timing, so that data is transferred to the bit line and the dummy bit line with the same timing. In other words, the replica circuit is operated with optimal timing. Also, since the memory cell and the dummy memory cell are connected to the same word line, both the capacitor cells can be refreshed at the same time, i.e., the memory cell and the dummy memory cell can be simultaneously refreshed. Therefore, it is advantageously not necessary to provide a special operation of refreshing only the dummy memory cell. Note that the memory cell and the dummy memory cell may be connected to different word lines.

Also, the bit line and the dummy bit line as well as the data line and the dummy data line are arranged in parallel with each other. Therefore, as compared to a case where the bit line and the dummy bit line as well as the data line and the dummy data line are arranged in perpendicular to each other, the load of the dummy data line and the load of the data line can be caused to be equal to each other, so that timing generation by the replica circuit including the dummy data line can advantageously optimize the timing of amplifying the data line. Although the relationship between the bit line and the data line is herein mentioned, if data has become static, the replica circuit configuration may be such that the data line is directly connected to the bit line or the data line is connected via a switch to the data line.

Also, if the dummy memory array 2 is arranged adjacent to the row decoder 3 as shown in FIG. 1, then when a delay circuit for adjusting the output timing of the output signal DACNT of the data line sense amplifier control signal generating logic circuit 7 is provided, the circuit operation timing is an earliest, so that data output can be performed with earliest timing, as compared to a case where the dummy memory cell is located elsewhere, for example, a farthest place from the row decoder 3. This is effective for an increase in speed of the memory. Also, the arrangement of a delay circuit for finely adjusting the timing is effective as measures against an erroneous operation when the output timing is excessively early. Note that the adjustment of the delay circuit can be performed by a means that employs a fuse, a nonvolatile memory or the like since a mask does not need to be changed or the like.

Also, since adjacent capacitors of the dummy memory cells are joined together, the amount of electric charges read to the bit line is increased, so that a stable sense amplifier operation can be achieved, and therefore, the operation of the replica circuit can be guaranteed. Note that any configuration in which the dummy memory cell has a larger capacitor than that of the memory cell can be employed. The electrodes of the capacitors may be short-circuited, or alternatively, a new capacitor may be provided.

Also, when as shown in FIG. 1 the memory arrays 1 and the dummy memory arrays 2 are arranged in the same number, the replica circuit can be activated from a place of a selected word line physically corresponding to a location where each array is provided, so that optimal timing can be generated. Also, since the memory array 1 and the dummy memory array 2 are connected to the common word lines, so that dummy memory cell data and memory cell data are read from a selected word line, and therefore, more optimal timing can be generated. Also, if only one dummy memory array 2 is provided, it is possible to resolve problems, such as a failure of optimization of timing, a process defect due to a non-uniform pattern of memory cells, and an area overhead due to dead space where a dummy memory array is not provided.

Also, since the dummy memory cell includes a single transistor and a source node of the transistor is connected to the power supply, the defect of the dummy memory cell capacitor does not need to be taken into consideration, and data required for reading does not need to be written to the dummy memory cell. Although it has been assumed above that the dummy memory cell includes a single transistor, the dummy memory cell may include two or more transistors.

Figure 6:
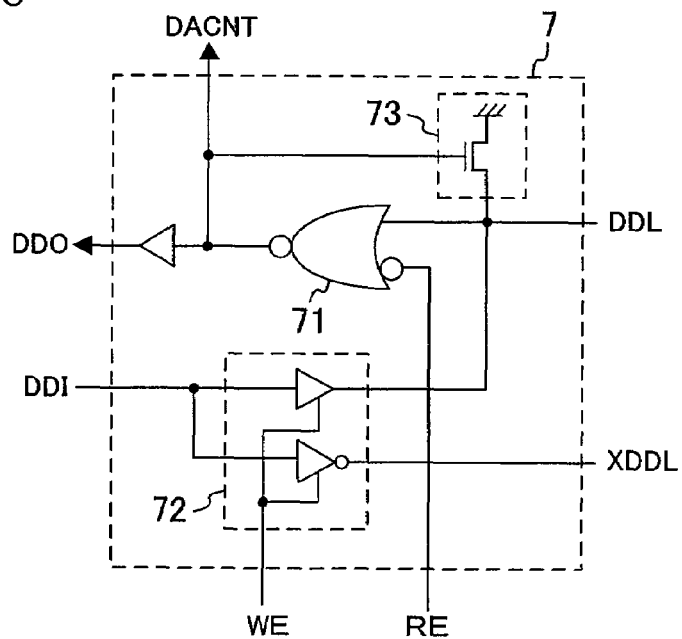
FIG. 6 is a circuit diagram showing a variation of the data line sense amplifier control signal generating logic circuit of FIG. 4.

Also, as shown in FIG. 6, a latch circuit 73 may be provided at an output of the logic circuit 7. In this case, advantageously, even when the column switch connected to the dummy sense amplifier is switched OFF, output data can be latched when the peripheral circuit read operation reference signal RE is at H.

Figure 7:
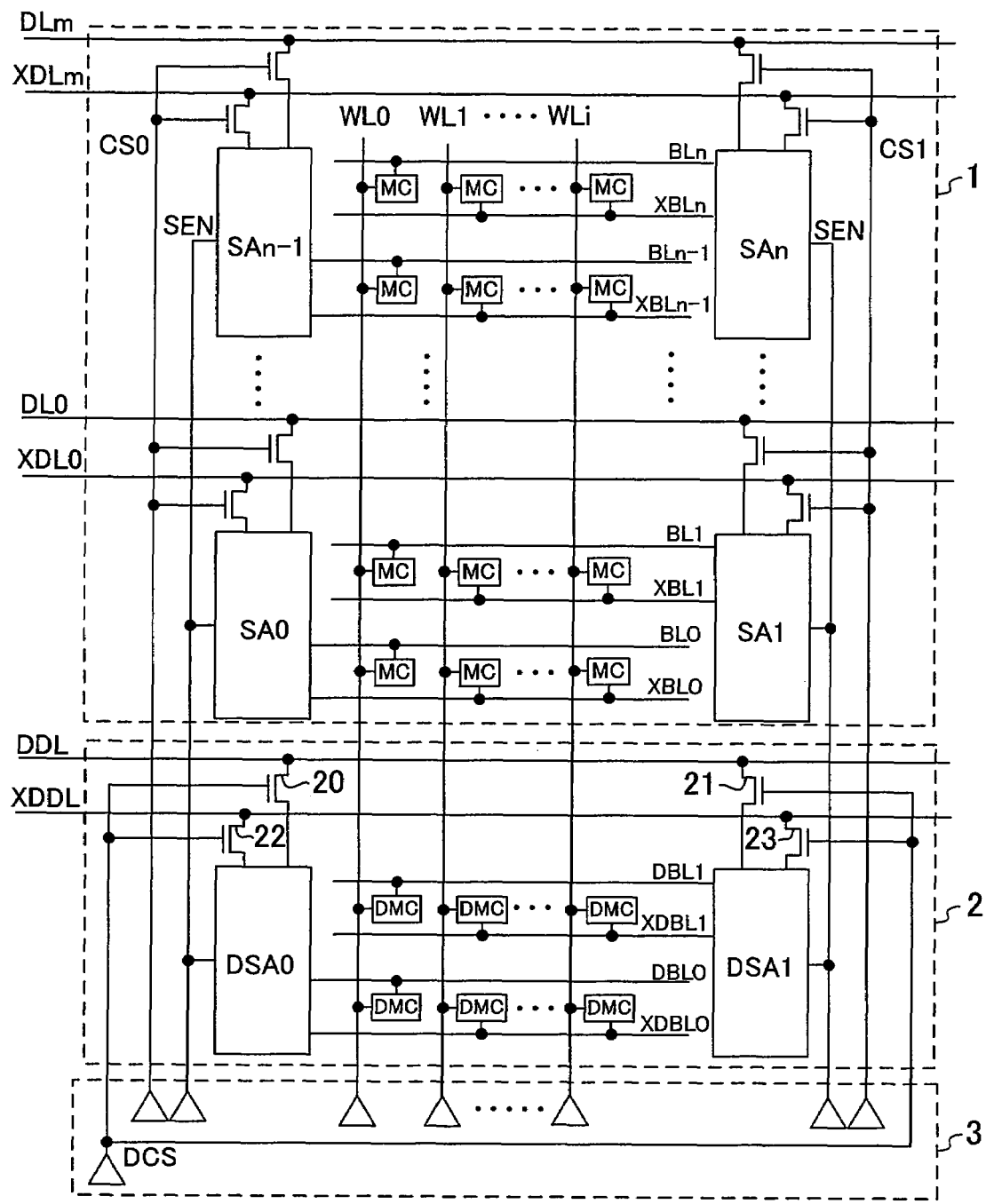
FIG. 7 is a block diagram showing a variation of the dummy memory array of FIG. 2.

Next, a configuration in which two or more sense amplifiers are connected via switches to a dummy data line will be described with reference to FIG. 7. As shown in FIG. 7, two sense amplifiers DSA0 and DSA1 are connected to dummy data lines DDL/XDDL via N-channel transistors 20 and 21/22 and 23 whose gates are controlled in accordance with a control signal DCS. Thereby, data can be read from the dummy data lines DDL/XDDL of dummy memory cells at a rate two times higher than that of data lines DL/XDL of memory cells. Therefore, when a potential difference required to amplify the data lines DL/XDL by a data line sense amplifier 6 to a potential difference required to switch a NOR circuit 71 of a data line sense amplifier control signal generating logic circuit 7 is 1:2, the timing of generating a data line sense amplifier activation signal of a replica circuit and the timing of amplification by the data line sense amplifier 61 can be caused to be equivalent.

Also, if a control signal of a column switch for the sense amplifier and a control signal of a column switch for the dummy sense amplifier are arranged to be different from each other, the column switch for the dummy sense amplifier can be easily controlled irrespective of a column decode input. Therefore, a plurality of dummy sense amplifiers can be connected to a single dummy data line. Also, even when the number of dummy sense amplifiers is changed, the timing of driving the column switch for the sense amplifier and the drive performance are advantageously not affected.

Figure 8:
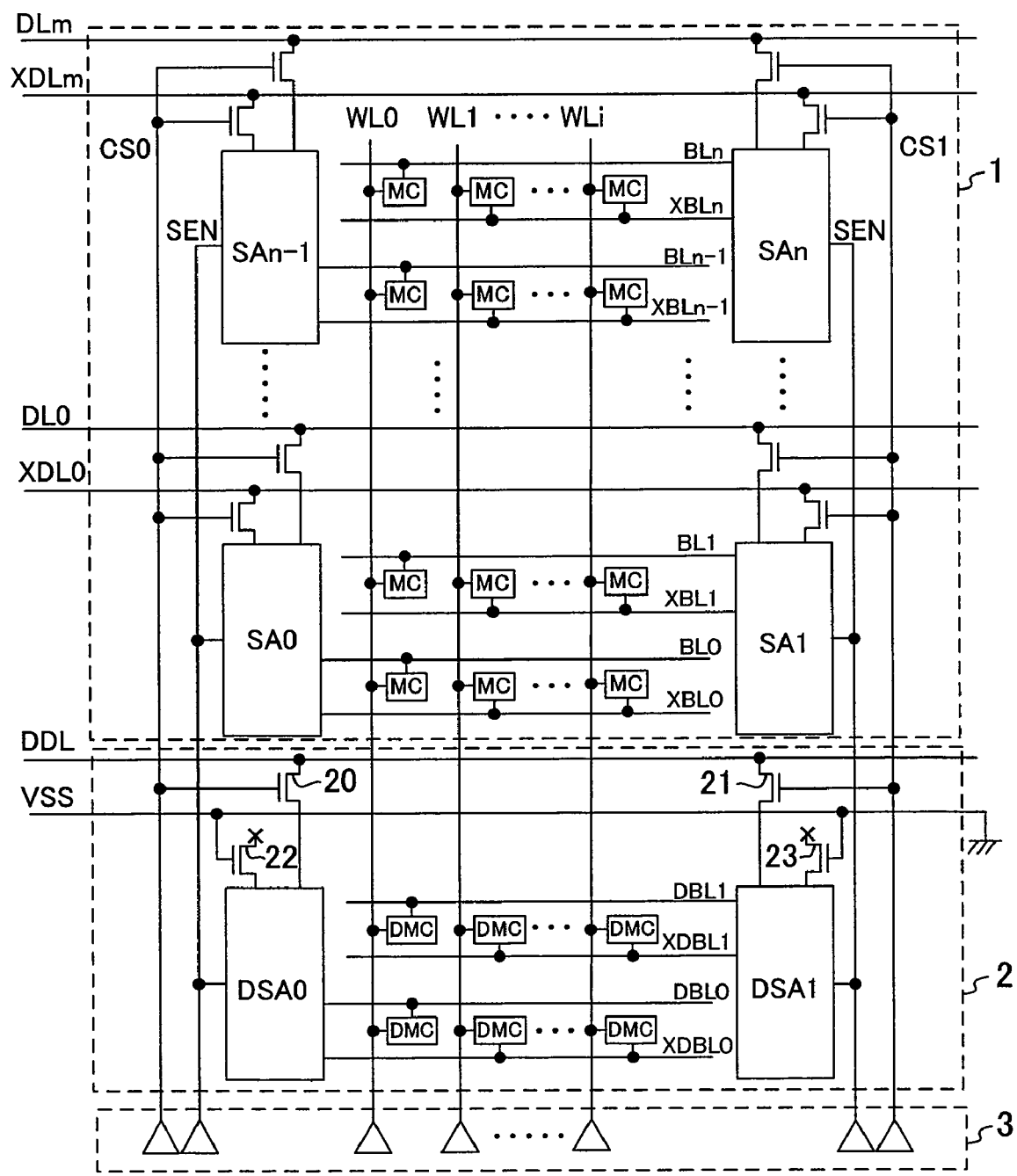
FIG. 8 is a block diagram showing another variation of the dummy memory array of FIG. 2.

Next, a configuration in which a dummy data line is not a complementary line and a line adjacent to the dummy data line is a power supply line, will be described with reference to FIG. 8. As shown in FIG. 8, a dummy data line DDL is connected to sense amplifiers DSA0 and DSA1 via N-channel transistors 20 and 21 whose gates are driven by column switch signals CS0 and CS1, respectively. N-channel transistors 22 and 23 are connected to the sense amplifiers DSA0 and DSA1, respectively, and each have a gate connected to a power supply VSS and an open source. With this configuration, the VSS power supply line, which is employed instead of the complementary dummy data line, can be used to provide a shielding effect against a read operation of the dummy data line required for a replica circuit operation, and can also be expected to provide an effect of reducing current consumption since only one dummy data line, which has a heavy load, is operated. Although the VSS power supply line is employed above, a VDD power supply line may be employed. In this case, the VDD power supply line may be connected to the source node of the N-channel transistor, and the gate node may be connected to the power supply VSS.

Note that if the above-described forms may be combined, a more advantageous effect can be expected.

Variation of First Embodiment

Figure 9:
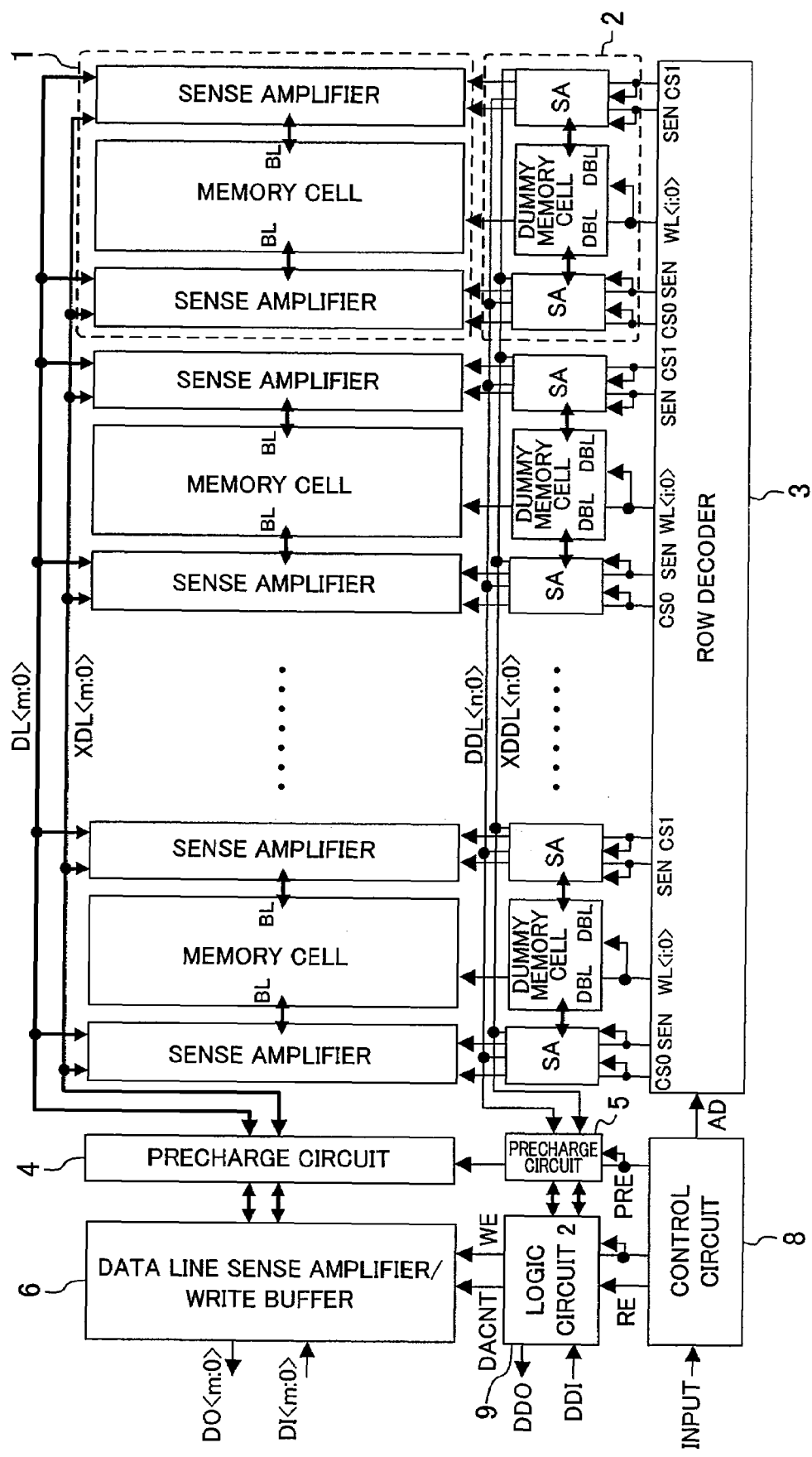
FIG. 9 is a block diagram showing a major configuration of a semiconductor storage device according to a variation of the first embodiment of the present invention.
Figure 10:
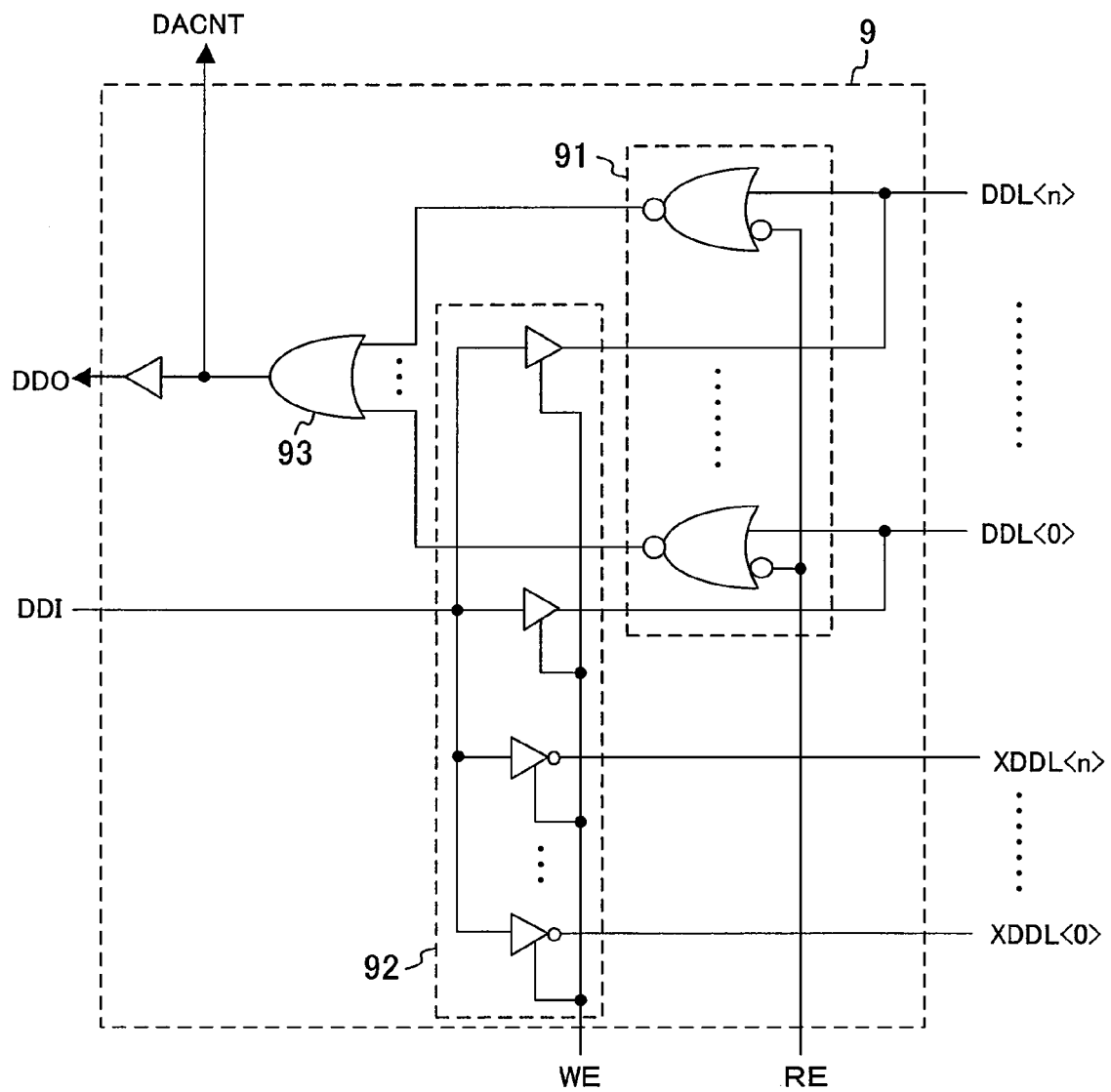
FIG. 10 is a circuit diagram showing a specific circuit configuration of a data line sense amplifier control signal generating logic circuit of FIG. 9.

FIG. 9 is a block diagram showing a major configuration of a semiconductor storage device according to a variation of the first embodiment of the present invention. Particularly, the data line sense amplifier control signal generating logic circuit 9 is different from that of the first embodiment. FIG. 10 shows a specific circuit diagram. In FIG. 10, the data line sense amplifier control signal generating logic circuit 9 comprises a NOR circuit group 91, a dummy write buffer group 92, and an OR circuit 93, where the logical sum of a plurality of dummy data lines DDL<0> to DDL<n> serves as a control signal DACNT for a data line sense amplifier 6.

According to this variation, since the logical sum of the dummy data lines is used, even if one of the dummy memory cells is defective, data can be transferred from the remaining dummy data lines to the data line sense amplifier control signal generating logic circuit 9, so that a desired replica circuit operation can be advantageously achieved. Typically, the number of dummy data lines can be determined based on a trade-off between the frequency of occurrence of a defect during a process and the area overhead of the circuit. Also, all pieces of data on two or more dummy data lines have the same logical value.

Note that if this embodiment is combined with the first embodiment, a more advantageous effect can be expected.

Second Embodiment

Figure 11:
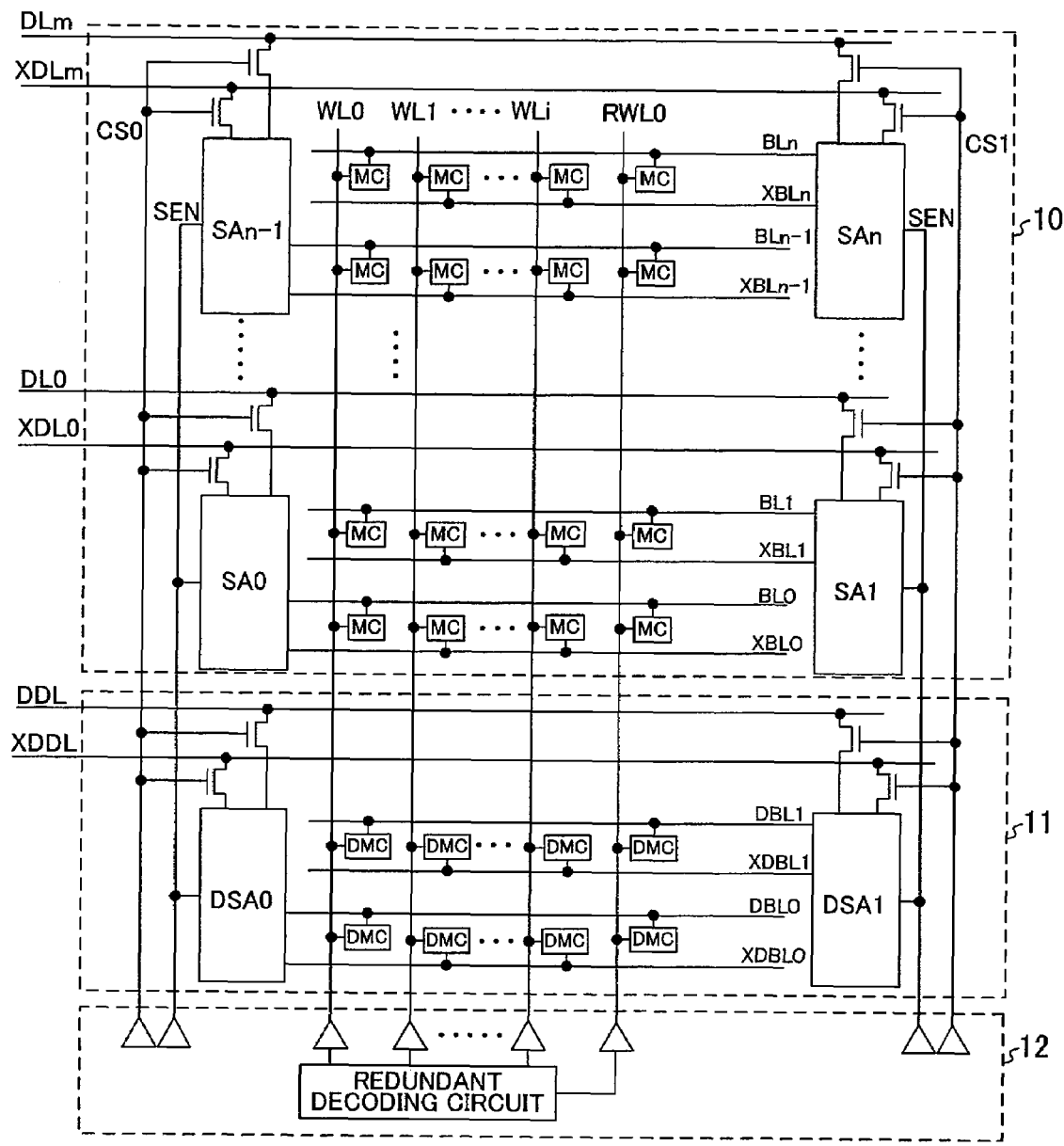
FIG. 11 is a block diagram showing a specific circuit configuration of a memory array, a dummy memory array and a row decoder of a semiconductor storage device according to a second embodiment of the present invention.

FIG. 11 is a block diagram showing a major configuration of a semiconductor storage device according to a second embodiment of the present invention. In FIG. 11, the semiconductor storage device comprises a memory array 10 and a dummy memory array 11 including a redundant word line RWL0, and a row decoder 12 including a redundant decoding circuit that can switch an access to the redundant word line RWL0 when a defect occurs in the memory array 10 and the dummy memory array 11.

In the thus-configured semiconductor storage device, if a defect occurs in a memory cell connected to a word line WL0 of the memory array 10, the address of a redundant word line is designated using, for example, a fuse function. If an access hits the defective word line WL0, the redundant decoding circuit performs a control to switch the access to the redundant word line RWL0 so that data is transferred from a redundant memory cell to a bit line BL. Thereby, the defective cell can be relieved.

Similarly, even if a defect occurs in a dummy memory cell connected to the word line WL0 of the dummy memory array 11, the redundant decoding circuit can perform a control so as to switch an access to the redundant word line RWL0, so that the dummy memory array 11 can be relieved.

Thus, by applying a redundant circuit, such as a conventional redundant memory cell and redundant word line, to a dummy memory array, the dummy memory array can be relieved if it is defective, so that a stable replica circuit can be achieved, and a dead space in the dummy memory array can be advantageously used for arrangement of a redundant memory cell.

Note that if this embodiment is combined with the first embodiment and its variation, a more advantageous effect can be expected.

Third Embodiment

Figure 12:
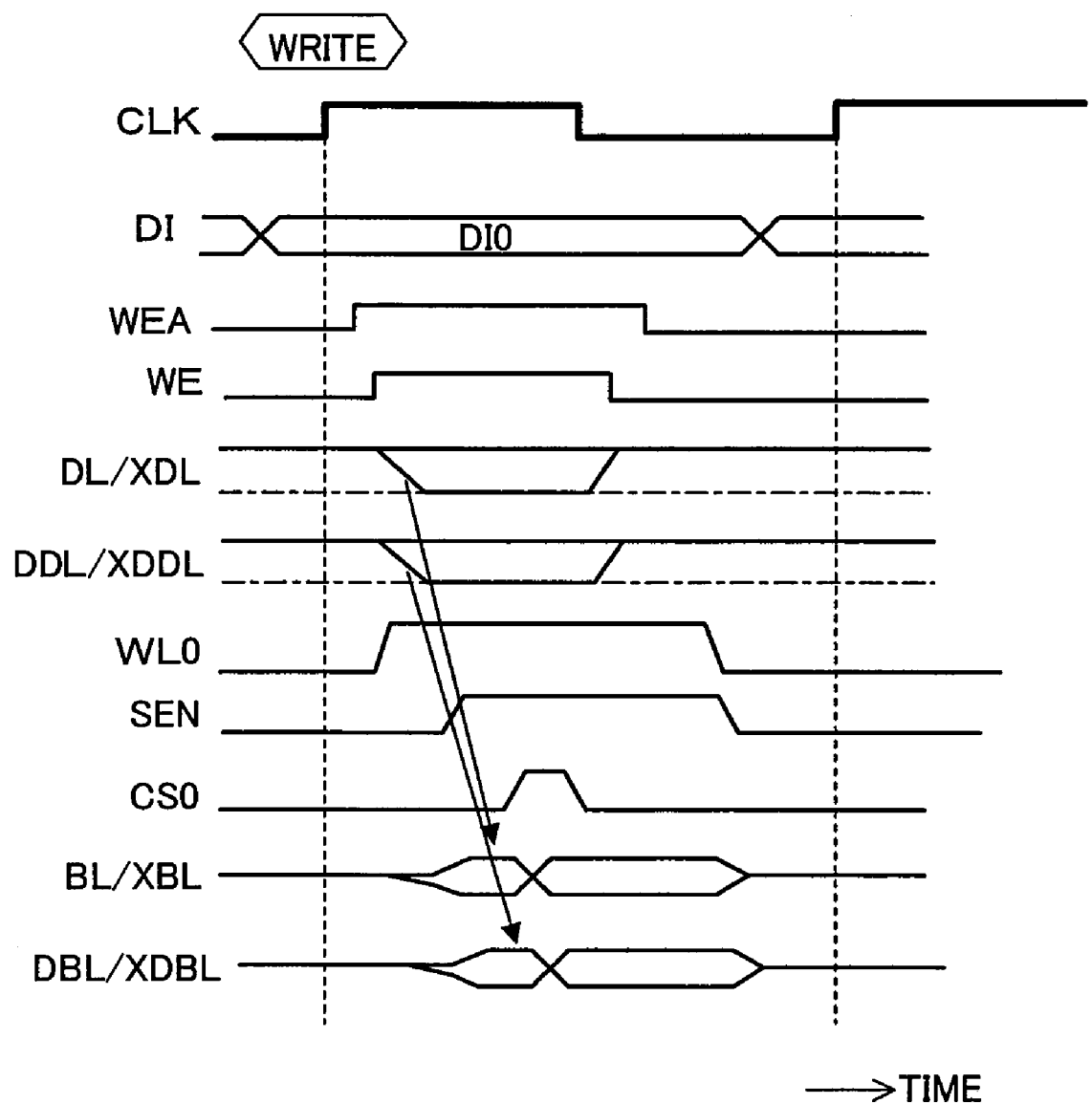
FIG. 12 is a timing chart showing a data write operation of a semiconductor storage device according to a third embodiment of the present invention.

Next, a third embodiment of the present invention will be described. The semiconductor storage device of this embodiment has the same major configuration as that of FIGS. 1 to 4. A data write operation to a dummy memory array will be described with reference to a timing chart shown in FIG. 12.

Initially, when a write request is input to the memory, the control circuit 8 generates a write operation reference signal WEA and a peripheral circuit write operation reference signal WE. Thereby, a data input signal DI is driven and transferred to the data lines DL/XDL by the write buffer 6. At the same time, the write buffer 72 of the data line sense amplifier control signal generating logic circuit 7 transfers a dummy data input signal DDI to the dummy data lines DDL/XDDL.

Also, by the write operation reference signal WEA, an input address signal is transferred to the row decoder 3, and the selected word line WL0 is activated by a decode signal. Thereafter, data read from a memory cell and a dummy memory cell connected to the selected word line WL0 to the bit lines BL/XBL and the dummy bit lines DBL/XDBL, is amplified in accordance with a sense amplifier activation signal SEN. Next, by activating a column switch signal CS0 that drives the gates of N-channel transistors that connect the data line with the sense amplifier and the dummy data line with the sense amplifier, data on the data lines DL/XDL is written into a memory cell via a sense amplifier. Similarly, data on the dummy data lines DDL/XDDL is also written into a dummy memory cell via a sense amplifier.

Finally, the write operation reference signal WEA and the peripheral circuit write operation reference signal WE go to the L level after a predetermined period of time, so that the internal circuit of the memory goes to the standby state to get ready for the next operation.

As described above, a function of writing desired data to a memory cell and, at the same time, writing desired data to a dummy memory cell during a write request is provided, so that data from the dummy memory cell to the dummy bit line, the sense amplifier and the dummy data line can be advantageously caused to have a desired data value. Also, initialization of a dummy memory cell or writing of desired data to a dummy memory cell is performed at the same time when writing of a memory cell is performed, so that an overhead of a circuit operation can be advantageously eliminated.

Also, the input signal DDI of the write buffer 72 connected to the dummy bit lines DDL/XDDL is connected to the power supply VDD or a ground potential, so that fixed data can be written to a dummy memory cell connected to a desired address in accordance with a write request without adding a new input signal to the memory. Therefore, the number of pins of the memory can be reduced.

Also, though not shown, for example, a selection circuit may be used to form two signal pathways that are different by one stage of inverter, and may be switched in accordance with the potential level of the input signal DDI, so that the logical value of the input signal DDI of the write buffer 72 connected to the dummy data lines DDL/XDDL can be externally changed, and, even if the logic level of the input signal DDI is changed, the logic level during activation of the output signal DACNT of the data line sense amplifier control signal generating logic circuit 7 is not changed. In this case, by eliminating the non-uniformity of read operations of a dummy memory cell (e.g., the L level is easily read out as compared to the H level, etc.) due to process conditions, external conditions or the like by, for example, using a single data value that is easy to read, a stable operation of a replica circuit including a dummy memory cell can be achieved.

Also, by providing a function of activating sense amplifiers connected to all word lines and all dummy memory cells, and switches connecting the sense amplifiers connected to all dummy memory cells with dummy data lines, desired data for a replica circuit operation can be simultaneously written into the dummy memory cells. Therefore, for example, the writing can be efficiently executed during an idle time, such as an initial sequence, a standby mode or the like of the memory. Also, if this function is used as a mode setting function, then when, for example, a control is added for stopping a write buffer for writing a dummy data line during times other than the mode-set simultaneous write operation, a write operation to a dummy memory cell including a dummy data line is limited during a normal write request to the memory, resulting in a reduction in current consumption. Also, since the write operation to a dummy memory cell does not need to be performed at the same time when a normal operation is performed, a stable replica circuit operation can be achieved by, for example, performing the write operation to a dummy memory cell with a margin by sufficiently lowering an operating frequency.

Note that if this embodiment is combined with each of the above-described embodiments, a more advantageous effect can be expected.

Variation of Third Embodiment

Figure 13:
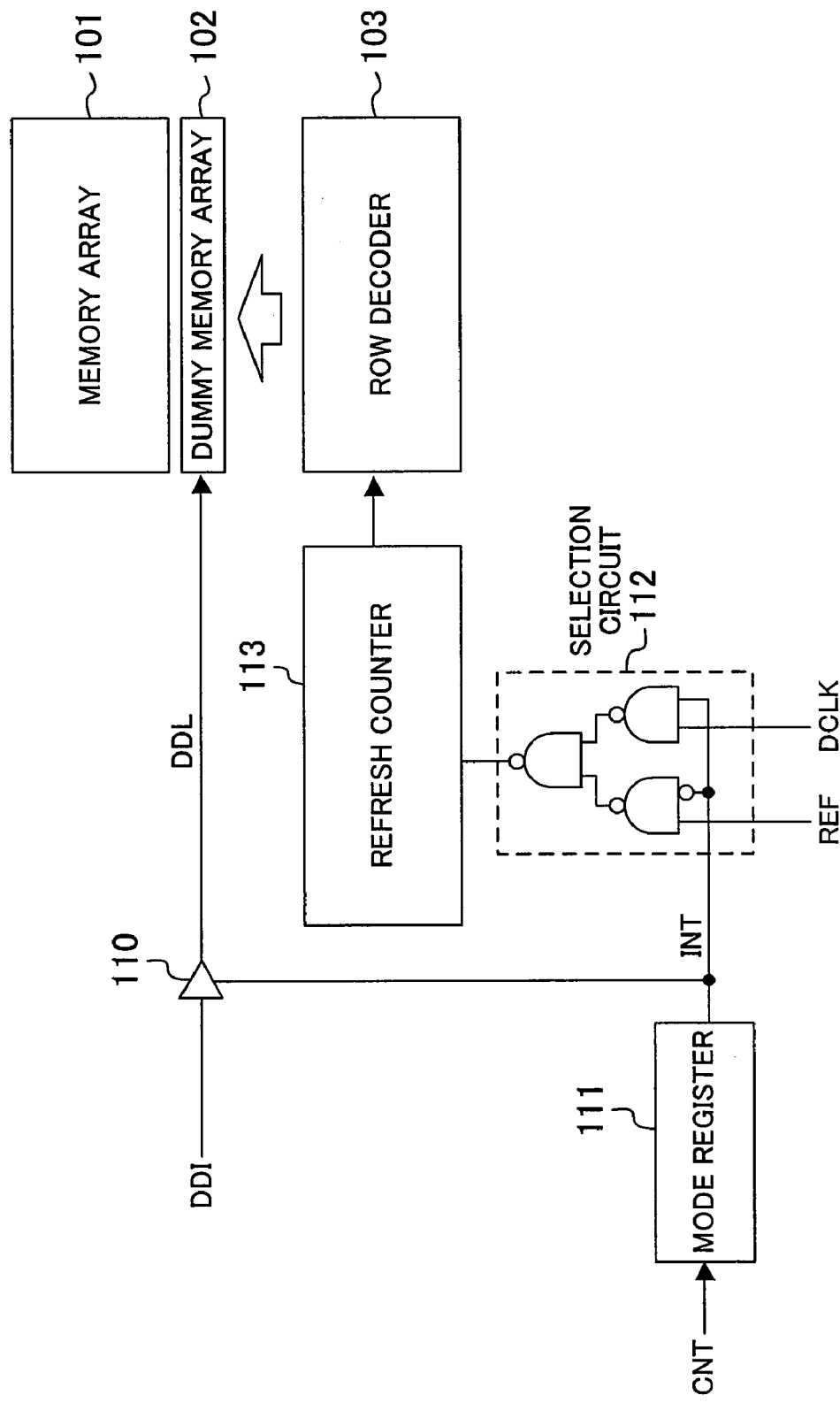
FIG. 13 is a block diagram showing a major configuration of a semiconductor storage device according to a variation of the third embodiment of the present invention.

FIG. 13 is a block diagram showing a major configuration of a semiconductor storage device according to a variation of the third embodiment of the present invention. A data write operation to a dummy memory array 102 provided for a memory array 101 of the semiconductor storage device of FIG. 13 will be described.

A flag INT that defines a data write operation to the dummy memory array 102 is activated in a mode register 111 in accordance with an externally input control signal CNT. Thereby, a write buffer 110 is activated, so that a dummy data input signal DDI is transferred to a dummy data line DDL. Since the flag INT has H data in a selection circuit 112, an input signal DCLK in which the H level and the L level are alternated in predetermined cycles is selected, and a refresh counter 113 is counted up. An address signal selected by a count-up operation of the refresh counter 113 is decoded by a row decoder 103, and all word lines are successively selected as is similar to during the refresh operation. As in this word line operation, a sense amplifier connected to a selected word line is also activated, and only a switch connected to a selected sense amplifier of switches connecting sense amplifiers (not shown) connected the dummy memory array 102 and the dummy data line DDL is activated, so that desired data can be written to the dummy memory array 102. By continuing this operation until one cycle of the refresh counter 113 is completed, data can be written to all the cells in the dummy memory array 102.

Also, for a normal refresh request, since the flag INT is in an inactive state, the refresh counter 113 is arranged to receive a refresh command signal REF and then operate.

As described above, an existing memory circuit can be used to initialize the dummy memory array 102 without an operation of causing a large current to instantaneously flow, such as a simultaneous write operation to the dummy memory array 102 and with timing different from that of a normal operation. In addition, the memory array 101 and the dummy memory array 102 can be simultaneously refreshed. Therefore, a circuit having an optimal circuit operation, current consumption and circuit area can be achieved.

Although a write operation to the dummy memory array 102 is regulated by mode setting using the mode register 111 as an example, any circuit configuration that can achieve the write operation to the dummy memory array 102 using the refresh counter 113 may be employed.

Fourth Embodiment

Figure 14:
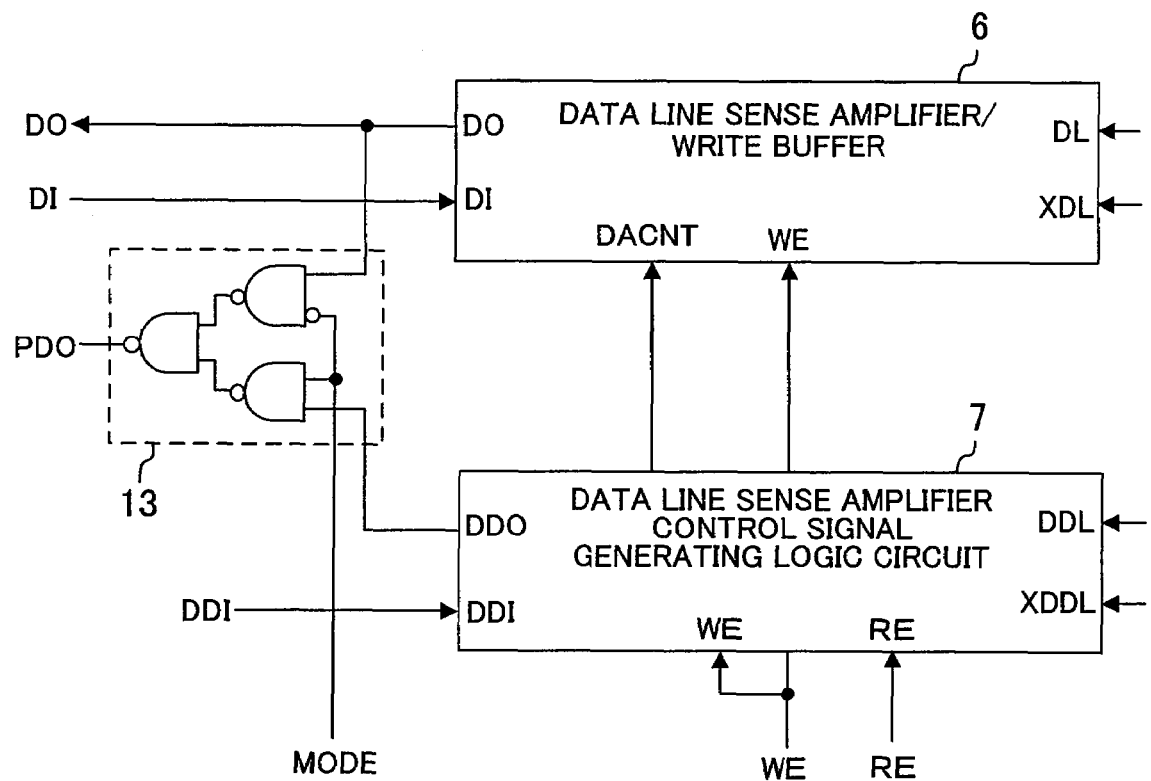
FIG. 14 is a block diagram showing a major configuration of a semiconductor storage device according to a fourth embodiment of the present invention.
Figure 15:
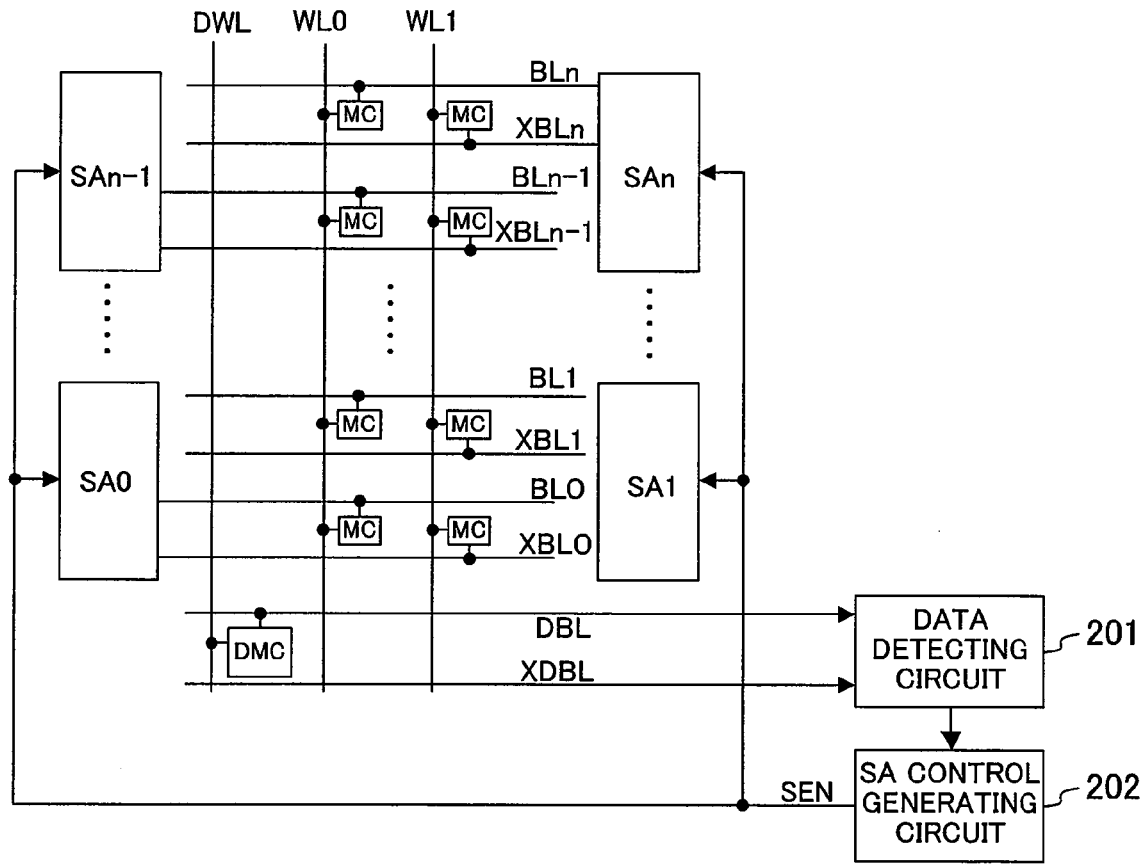
FIG. 15 is a block diagram showing a major configuration of a conventional semiconductor storage device.
Figure 16:
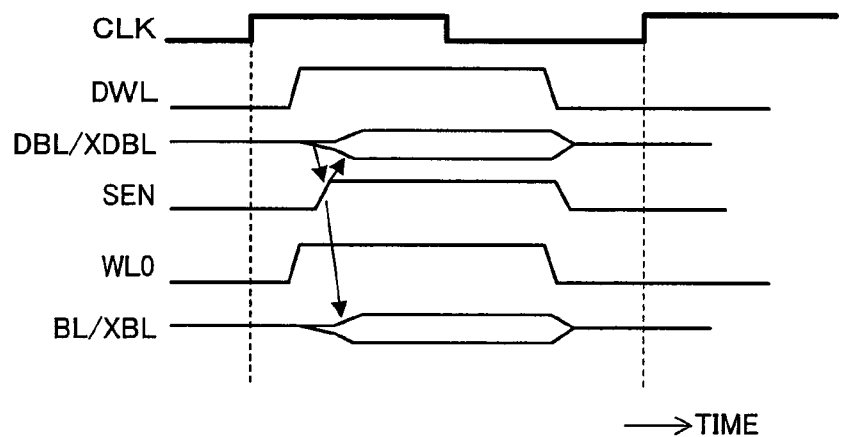
FIG. 16 is a timing chart showing a circuit operation of the semiconductor storage device of FIG. 15.

FIG. 14 is a block diagram showing a major configuration of a semiconductor storage device according to a fourth embodiment of the present invention. In FIG. 14, the semiconductor storage device comprises an output selection circuit 13 having a circuit configuration in which an output signal PDO during a test is switched between a test output of a data output DO from a memory cell and an output signal DDO of a data line sense amplifier control signal generating logic circuit 7, in accordance with a mode selection signal MODE.

A data read operation of a dummy memory cell in the thus-configured semiconductor storage device will be described.

Figure 5:
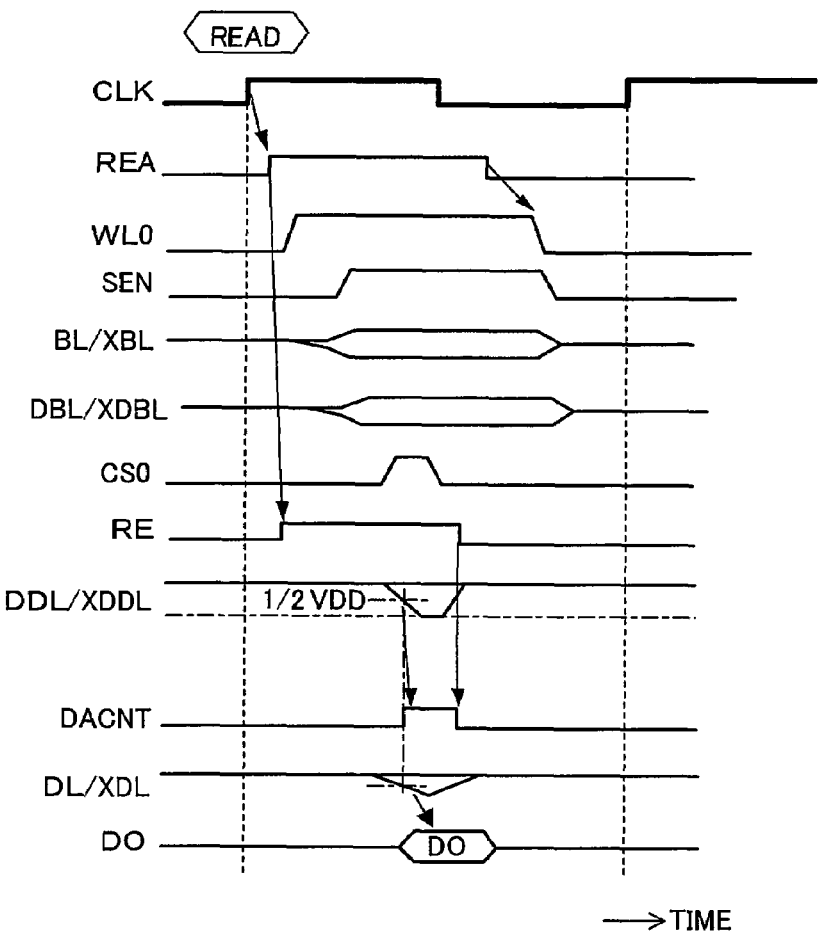
FIG. 5 is a timing chart showing a data read operation of the semiconductor storage device of FIG. 1.

In the replica circuit operation of FIG. 5, when the signal DACNT goes to the H level, the other output signal DDO of the data line sense amplifier control signal generating logic circuit 7 also goes to the H level as shown in FIG. 4. In this case, if the mode selection signal MODE is at the H level, H-level data is output to the output signal PDO.

Also, when the mode selection signal MODE is at the L level, the output signal DO from a memory cell is output to the test output signal PDO. Thus, ON/OFF of an external output of the output DDO of the data line sense amplifier control signal generating logic circuit 7 can be switched.

As described above, a means for outputting data of a dummy memory cell to the outside by selecting modes of a test result of the memory is provided, so that it is possible to investigate a defect in a replica circuit including the dummy memory cell. Therefore, for not only memory cells but also dummy memory cells, a defective portion can be identified and a memory relief process, such as redundant relief, can be performed.

Although it has been described as an example that the output DDO of the data line sense amplifier control signal generating logic circuit 7 is directly output via a selection signal, a circuit configuration in which the output DDO is latched to obtain a stable external output result may be employed.

Also, if the data line sense amplifier control signal generating logic circuit 7 has a plurality of outputs DDO, then when a part of or the whole pathway of data output is used, a test output terminal that was typically provided during testing can be used to read out data from a dummy memory cell without additionally providing a particular output terminal for confirming data of the dummy memory cell. Therefore, the number of terminals of the memory or the circuit area can be advantageously reduced.

Also, a precharge circuit may be provided for each of a data line and a dummy data line so that the precharge potential of the data line is different from the precharge potential of the dummy data line. As an example, the precharge potential of the dummy data line is caused to be a VDD potential, the timing of activating a read amplifier for amplifying the data line is generated using the switching property of a transistor, and the precharge potential of the data line is caused to be a ½-VDD potential, thereby making it possible to suppress power consumed by the data line (there are a number of data lines in the memory) to ½ as compared to the VDD precharge potential. Therefore, the power consumption of the memory can be advantageously reduced.

Note that if this embodiment is combined with each of the above-described embodiments, a more advantageous effect can be expected.

As described above, in the semiconductor storage device of the present invention, the timing of activating a sense amplifier for amplifying a data line having a heaviest load during a data access time (the load of a data line varies depending on the memory capacity) is logically determined, so that a quick access time can be achieved and various memory specifications can be easily achieved. The semiconductor storage device of the present invention memory is useful for, e.g., a system LSI having a large number and many kinds of specifications.

What is claimed is:

1. A semiconductor storage device comprising:
   a memory cell;
   a word line and a bit line connected to the memory cell;
   a first sense amplifier connected to the bit line;
   a dummy memory cell;
   a dummy bit line connected to the dummy memory cell;
   a second sense amplifier connected to the dummy bit line;
   a data line connected to the first sense amplifier;
   a third sense amplifier connected to the data line;

a dummy data line connected to the second sense amplifier; and a logic circuit connected to the dummy data line, wherein an output signal of the logic circuit is an input signal that activates the third sense amplifier.

2. The semiconductor storage device of claim 1, wherein the logic circuit detects that a potential on the dummy data line of static data generated by the second sense amplifier amplifying dynamic data read out to the dummy bit line exceeds a switching potential of a transistor, and outputs a signal as an input signal for activating the third sense amplifier.

3. The semiconductor storage device of claim 1, further comprising:

a latch circuit at an output of the logic circuit.

4. The semiconductor storage device of claim 1, further comprising:

a section for latching a signal on the dummy data line, the signal being input to the logic circuit, depending on a logical value of an output signal of the logic circuit.

5. The semiconductor storage device of claim 1, wherein the memory cell and the dummy memory cell each include a transistor and a capacitor.

6. The semiconductor storage device of claim 1, wherein a word line connected to the dummy memory cell is the same as the word line connected to the memory cell.

7. The semiconductor storage device of claim 1, wherein the bit line and the dummy bit line are arranged in parallel with each other and the data line and the dummy data line are arranged in parallel with each other.

8. The semiconductor storage device of claim 1, wherein the dummy memory cell is arranged adjacent to a row decoder including a word driver, and a delay circuit for adjusting output timing of the logic circuit is provided.

9. The semiconductor storage device of claim 1, wherein adjacent capacitors of the dummy memory cells are joined together.

10. The semiconductor storage device of claim 1, wherein a dummy memory array including the dummy memory cell, the dummy bit line and the second sense amplifier is provided for each memory array including the memory cell, the word line, the bit line and the first sense amplifier.

11. The semiconductor storage device of claim 1, wherein the dummy memory cell includes a single transistor, and a source node of the transistor is connected to a power supply.

12. The semiconductor storage device of claim 1, wherein two or more of the second sense amplifiers are connected to the dummy data line via switches.

13. The semiconductor storage device of claim 12, wherein a control signal for a switch connecting the data line and the first sense amplifier is different from a control signal for a switch connecting the dummy data line and the second sense amplifier.

14. The semiconductor storage device of claim 1, wherein the dummy data line is not a complementary line, and a line adjacent to the dummy data line is a power supply line.

15. The semiconductor storage device of claim 1, wherein the logic circuit has a function of calculating a logical sum of two or more of the dummy data lines.

16. The semiconductor storage device of claim 15, wherein pieces of data on the two or more dummy data lines have the same logical value.

17. The semiconductor storage device of claim 1, further comprising:

a redundant memory cell;

a redundant word line connected to the redundant memory cell;

a bit line connected to the redundant memory cell;

a redundant dummy memory cell; and a dummy bit line connected to the redundant dummy memory cell.

18. The semiconductor storage device of claim 17, wherein the logic circuit detects that a potential on the dummy data line of static data generated by the second sense amplifier amplifying dynamic data of the redundant dummy memory cell exceeds a switching potential of a transistor, and outputs a signal as an input signal for activating the third sense amplifier.

19. The semiconductor storage device of claim 1, further comprising:

a write buffer connected to the data line;

a write buffer connected to the dummy data line; and a section for writing data to the dummy memory cell during a write operation to the memory cell.

20. The semiconductor storage device of claim 19, wherein an input of the write buffer connected to the dummy data line is connected to a power supply or a ground potential.

21. The semiconductor storage device of claim 19, wherein a logical value of input data of the write buffer connected to the dummy data line can be externally changed, and the logic circuit has an invariable output logic.

22. The semiconductor storage device of claim 19, further comprising:

a section for simultaneously writing data to all the dummy memory cells.

23. The semiconductor storage device of claim 19, further comprising:

a refresh counter for controlling a refresh operation;

a section for writing data to the dummy memory cell connected to the word line selected using the refresh counter.

24. The semiconductor storage device of claim 1, further comprising:

a section for reading an output of the logic circuit to the outside.

25. The semiconductor storage device of claim 24, wherein ON/OFF of external output of the logic circuit can be switched.

26. The semiconductor storage device of claim 24, wherein a part of or the whole pathway of data output of the memory cell is used for external output of the logic circuit.

27. The semiconductor storage device of claim 1, further comprising:

a precharge circuit for precharging the data line and the dummy data line, wherein a precharge potential of the data line is different from a precharge potential of the dummy data line.

* * * * *